United States Patent
Lin et al.

(10) Patent No.: US 6,316,321 B1
(45) Date of Patent: Nov. 13, 2001

(54) METHOD FOR FORMING MOSFET

(75) Inventors: Yung-Chang Lin, Feng-Yuan; Jih-Wen Chou, Hsin-Chu; Tung-Po Chen, Tai-Chung, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/314,527

(22) Filed: May 19, 1999

(51) Int. Cl.$^7$ .................................................. H01L 21/336
(52) U.S. Cl. .................... 438/305; 438/303; 438/592; 438/595; 438/527
(58) Field of Search ..................... 438/305, 230, 438/514, 516, 527, 257, 261, 303, 595, 592; 257/344, 336

(56) References Cited

U.S. PATENT DOCUMENTS

| | | | | |
|---|---|---|---|---|
| 5,091,763 | * | 2/1992 | Sanchez | 357/23.9 |
| 5,234,850 | * | 8/1993 | Liao | 437/44 |
| 5,411,906 | * | 5/1995 | Johnson et al. | 437/44 |
| 5,641,698 | * | 6/1997 | Lin | 438/305 |
| 5,736,446 | * | 4/1998 | Wu | 438/305 |
| 5,747,373 | * | 5/1998 | Yu | 438/305 |
| 5,793,114 | * | 8/1998 | Nguyen et al. | 257/774 |
| 5,911,114 | * | 6/1999 | Naem | 438/684 |
| 5,915,182 | * | 6/1999 | Wu | 438/299 |
| 5,920,783 | * | 7/1999 | Tseng | 438/305 |
| 5,923,982 | * | 7/1999 | Kadosh et al. | 438/286 |
| 5,972,763 | * | 10/1999 | Chou et al. | 438/305 |
| 5,972,764 | * | 10/1999 | Huang et al. | 438/305 |
| 6,096,616 | * | 8/2000 | Nistler | 438/305 |
| 6,127,212 | * | 10/2000 | Chen | 438/199 |
| 6,153,455 | * | 11/2000 | Ling | 438/231 |

\* cited by examiner

*Primary Examiner*—Mary Wilczewski
*Assistant Examiner*—David Goodwin
(74) *Attorney, Agent, or Firm*—Powell, Goldstein, Frazer & Murphy LLP

(57) ABSTRACT

A method for forming MOSFET is disclosed. The method includes firstly providing a substrate, on which a gate without spacer is already formed. A first spacer is formed on sidewall of the gate, a lightly doped drain is subsequently formed in the substrate. Next, a second spacer is formed on the first spacer. Finally, a heavily doped drain is formed in the substrate. The present invention can enhance stability of resistance of the gate and reduce pollution of the machine. Therefore, quality and efficiency of the fabrication of MOSFET will be enhanced.

12 Claims, 2 Drawing Sheets

METHOD FOR FORMING MOSFET

BACKGROUND OF THE INVENTION

1. Field of the Invention

The present invention relates to the fabrication of MOSFET, and more particularly to a method for forming spacer of a gate.

2. Description of the Prior Art

It has been determined that hot-carrier effects will cause unacceptable performance degradation in NMOS devices built with conventional drain structures if their channel lengths are less than 2 μm. To overcome this problem, such alternative drain structures as lightly doped drains (LDDs) must used.

In the LDD structure, the drain is formed by an implant self-aligned to the gate electrode, and the other is self-aligned to the gate electrode against which an oxide spacer has been formed. The purpose of the lighter first dose is to form a lightly doped section of the drain at the edge near the channel. In NMOS devices, this dose is normally $1–2\times10^{13}$ atoms/cm$^2$ of phosphorus.

In the conventional fabrication of MOSFET, to form a gate, resist and etching are used after the metal-oxide-semiconductor (MOS) layer is deposited. Unfortunately, solvent used to strip the resist will erode the sidewall of the gate to lead to a narrower width and higher electric resistance. In the following implantation for LDD, the exposing sidewall of the gate is attacked by the ions going to be implanted into the substrate. The emancipated metal particles, such as Ti, will pollute the chamber of machine. Moreover, during the stripping of photoresist used for the LDD implantation, the sidewall of the gate will be eroded, too. Therefore, the quality of products and the efficiency of fabrication will be both reduced.

For the foregoing reasons, there is a need for solving the pollution of machine and the high electric resistance of gates to enhance both the quality of products and the efficiency of fabrication.

SUMMARY OF THE INVENTION

In accordance with the present invention, a method is provided for forming spacer of a gate in fabrication of MOSFET. It could substantially solve the problem of unstable resistance of a gate due to the attack of ions in implanting process. In one embodiment, a substrate, on which there is a gate without spacer, is firstly provided. Then, a first insulating layer, such as oxide, is deposited on the substrate and the gate. Subsequently, etch back the first insulating layer. Ion implantation is used to form a lightly doped drain in the substrate. Therein, implanted ions never pass through the first insulating layer. A liner layer, such as oxide, is formed on the substrate and the first insulating layer to serve as a stop layer of the following etching process. A etching process is used after a second insulating layer such as nitride is formed on the liner layer. Finally, ion implantation is used again to form a heavily doped drain in the substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention gives one more process than conventional in the fabrication of MOSFET. Therein, an extra spacer is formed before implanting to protect the gate from the attack of ions and the erosion due to solvent.

Figure 1:
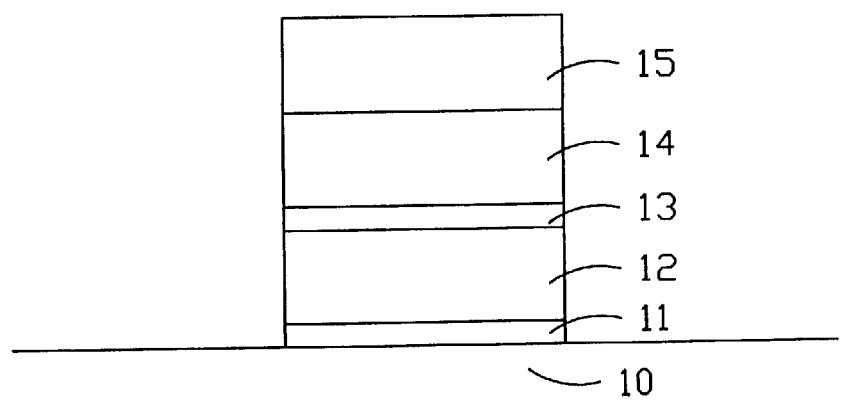
FIG. 1 shows the primary structure provided.

Referring to FIG. 1, In one embodiment of the present invention, a substrate 10 on which there is a gate without spacer is firstly provided. Therein, the gate contains a gate oxide 11 on the substrate 10, a polysilicon layer 12 on the gate oxide 11, a thin nitride layer 13 such as TiN on the polysilicon 12, a silicide layer 14 such as TiSi on the nitride 13, and an anti-reflection coat 15 on the silicide 14. The sidewall of the gate is non-insulated.

Figure 2:
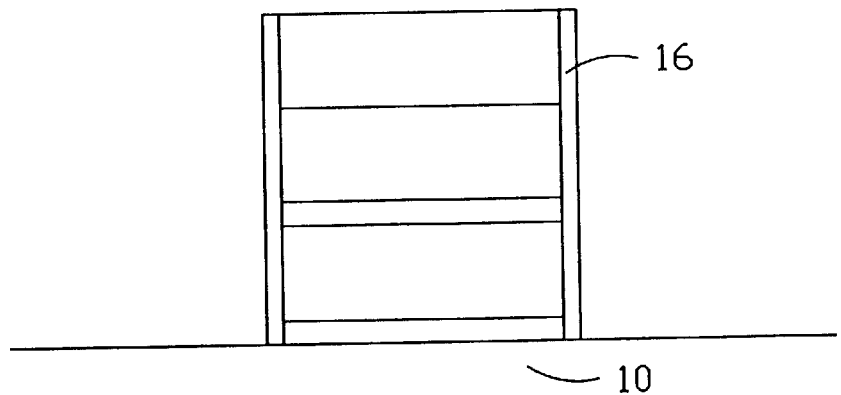
FIG. 2 shows the first spacer formed on the sidewall of the gate included in the primary structure.

Referring to FIG. 2, a thin oxide (or nitride) is deposited on the substrate 10 and the gate, then etched back until the oxide resides only on the sidewall of the gate. The residual oxide 16 serves as the first spacer and is approximately 50–400 angstroms thick.

Figure 3:
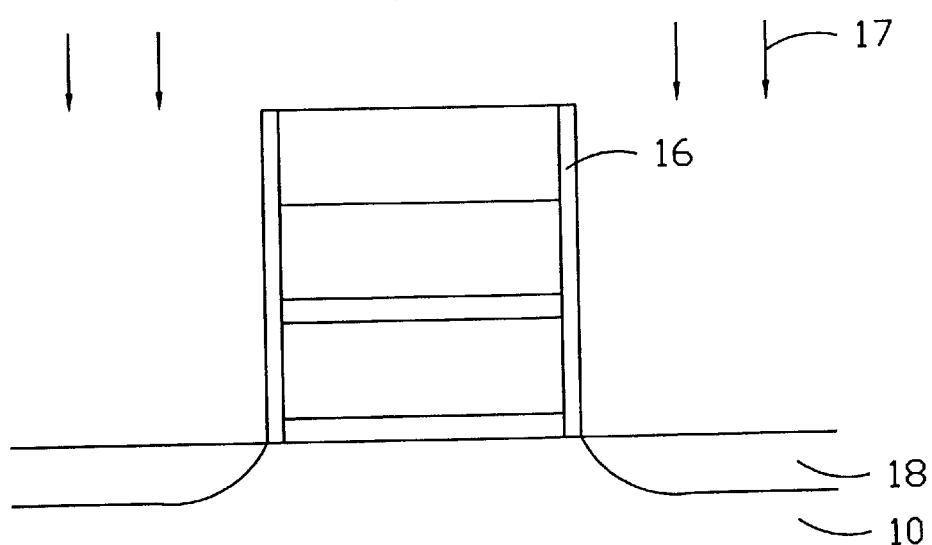
FIG. 3 shows the LDD formed in the substrate by ion implantation.

Referring to FIG. 3, ion implantation is used to form a lightly doped drain 18 in the substrate 10. For the process, ions (P$^+$ or N$^-$) 17 are implanted into the substrate 10 at a low temperature. Then, the lightly doped section of the drain at the edge near the channel is formed. During the implanting, the first spacer described above will protect the sidewall of the gate from the attack of ions and the erosion of solvent used to strip the photoresist in implantation process.

Further, as shown in FIG. 3, lightly doped drain 18 does not locate under residual oxide 16, which is a main characteristic of the invention. In other words, material and thickness and other parameters of either residual oxide 16 or ion implantation must be modified to satisfy the requirement—after "in implantation process".

Figure 4:
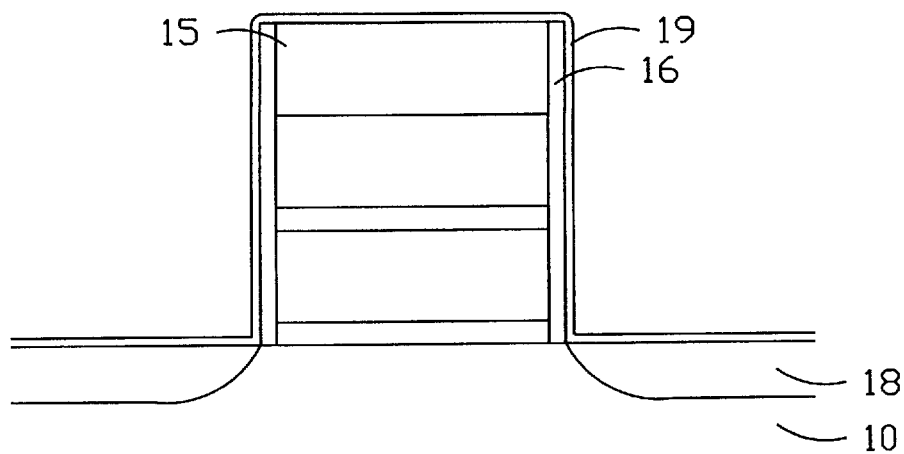
FIG. 4 shows the liner oxide formed on the first spacer.

Referring to FIG. 4, a liner oxide 19 is deposited on the substrate 10, the first spacer 16 and top side of anti-reflection coat 15 of the gate.

Figure 5:
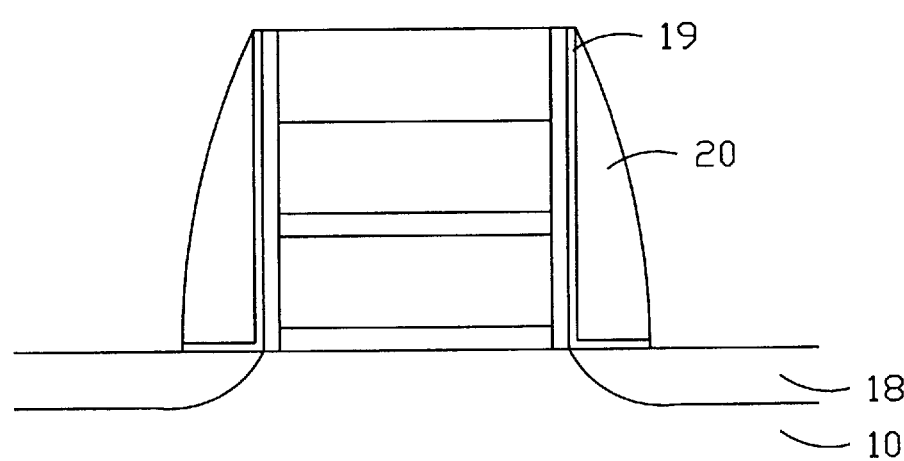
FIG. 5 shows the second spacer formed on the liner oxide.

Referring to FIG. 5, a nitride (or oxide) layer is deposited on the liner oxide 19 and then etched back. The residual nitride 20 on the sidewall of the gate serves as the second spacer. In the etching back procedure, the liner oxide 19 is as a stop layer to protect the LDD 18 in the substrate 10 from the etchant.

Figure 6:
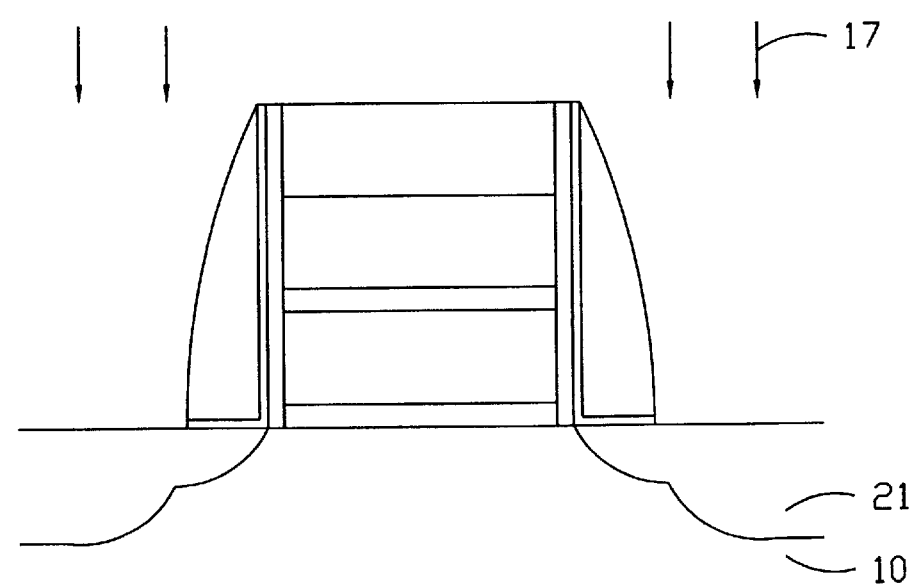
FIG. 6 shows the present invention completed.

Referring to FIG. 6, ion implantation is used again to provide a heavy doping which implants more ions 17 than previous into the substrate 10. Therefore, the heavily doped drain 21 containing enough P$^+$ or N$^-$ charge is achieved.

Although specific embodiments have been illustrated and described, it will be obvious to those skilled in the art that various modifications may be made without departing from what is intended to be limited solely by the appended claims.

What is claimed is:

1. A method for forming hemispherical grained silicon, comprising:

providing a substrate, on which there is a gate without spacer;

depositing a first insulating layer on said substrate and said gate;

etching back said first insulating layer;

forming a lightly doped drain in said substrate, herein said lightly doped drain is not located under said first insulating layer;

forming a liner layer on said substrate and said first insulating layer;

depositing a second insulating layer on said liner layer;

etching back said second insulating layer, said liner layer being used as an etch stop layer; and forming a heavily doped drain in said substrate.

2. The method according to claim 1, wherein said first insulating layer comprises oxide.

3. The method according to claim 1, wherein said first insulating layer comprises nitride.

4. The method according to claim 1, wherein said lightly doped drain is formed by ion implantation.

5. The method according to claim 1, wherein said liner layer comprises oxide.

6. The method according to claim 1, wherein said second insulating layer comprises nitride.

7. The method according to claim 1, wherein said second insulating layer comprises oxide.

8. The method according to claim 1, wherein said heavily doped drain is formed by ion implantation.

9. A method of forming MOSFET, said method comprising:

providing a structure having a substrate, on which a gate without spacer is already formed;

forming a first spacer on sidewall of said gate;

forming a lightly doped drain in said substrate, herein said lightly doped drain is not located under said first spacer;

forming a liner layer on both said first spacer and said substrate by etching said liner layer being used as an etch stop layer;

forming a second spacer on said liner layer; and forming a heavily doped drain in said substrate.

10. The method according to claim 9, wherein said first spacer comprises oxide.

11. The method according to claim 9, wherein said first spacer comprises nitride.

12. The method according to claim 9, wherein said liner comprises oxide.

* * * * *